(12) United States Patent
Chun

(10) Patent No.: US 7,472,321 B2
(45) Date of Patent: Dec. 30, 2008

(54) TEST APPARATUS FOR MIXED-SIGNAL SEMICONDUCTOR DEVICE

(75) Inventor: Byoung-Ok Chun, Chungcheongnam-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 343 days.

(21) Appl. No.: 11/040,132

(22) Filed: Jan. 20, 2005

(65) Prior Publication Data
US 2006/0015785 A1    Jan. 19, 2006

(30) Foreign Application Priority Data
Jul. 15, 2004    (KR) .................. 10-2004-0055108

(51) Int. Cl.
*G01R 31/28* (2006.01)

(52) U.S. Cl. ..................................... 714/724

(58) Field of Classification Search ............... 714/724, 714/733–734, 30, 740, 799; 324/765; 716/4; 702/122
See application file for complete search history.

(56) References Cited

U.S. PATENT DOCUMENTS

| | | | |
|---|---|---|---|
| 5,127,009 A * | 6/1992 | Swanson ................. | 714/734 |
| 5,646,521 A * | 7/1997 | Rosenthal et al. ....... | 324/158.1 |
| 6,292,415 B1 * | 9/2001 | Brehm ...................... | 365/201 |
| 6,298,320 B1 | 10/2001 | Buckmaster et al. | |
| 6,331,770 B1 * | 12/2001 | Sugamori ............... | 324/158.1 |
| 6,360,343 B1 * | 3/2002 | Turnquist ................. | 714/731 |
| 6,430,718 B1 * | 8/2002 | Nayak ...................... | 714/727 |
| 6,532,561 B1 * | 3/2003 | Turnquist et al. ......... | 714/738 |
| 6,536,006 B1 * | 3/2003 | Sugamori ................. | 714/724 |
| 6,571,358 B1 * | 5/2003 | Culotta et al. ............ | 714/33 |
| 6,629,282 B1 * | 9/2003 | Sugamori et al. ........ | 714/734 |
| 6,678,643 B1 * | 1/2004 | Turnquist et al. ......... | 703/14 |
| 6,753,693 B2 * | 6/2004 | Seo et al. .................. | 324/765 |

(Continued)

FOREIGN PATENT DOCUMENTS

JP    2000-137061    5/2000

(Continued)

OTHER PUBLICATIONS

English language abstract of the Japanese Publication No. 2000-137061.

(Continued)

*Primary Examiner*—Phung M Chung
(74) *Attorney, Agent, or Firm*—Marger Johnson & McCollom, P.C.

(57) ABSTRACT

A test apparatus for a mixed-signal semiconductor device that includes a plurality of event tester modules including analog and digital signal tester boards, a test head for event tester modules, a performance board including a socket for a DUT, a test fixture including a connection means, an option circuit for when the DUT is a mixed-signal integrated circuit including an analog and digital function blocks, a tester controller controlling the overall operation, and a switching parallel connection circuit sequentially connecting a single event tester board with a plurality of the DUTs. The event tester board and the DUTs are connected by a group unit. The number of parallel test is increased by an improved tester board or an improved performance board without the use of an extra event tester board for an analog signal test.

17 Claims, 6 Drawing Sheets

U.S. PATENT DOCUMENTS

| | | | |
|---|---|---|---|
| 6,998,847 B2 * | 2/2006 | Bertness et al. | 324/426 |
| 7,197,417 B2 * | 3/2007 | Pramanick et al. | 702/119 |
| 7,237,167 B2 * | 6/2007 | Inaba et al. | 714/740 |
| 7,275,197 B2 * | 9/2007 | Inaba et al. | 714/740 |
| 2005/0261856 A1 * | 11/2005 | Kushnick et al. | 702/117 |

FOREIGN PATENT DOCUMENTS

| | | |
|---|---|---|
| JP | 2001-091597 | 4/2001 |
| JP | 2001-134458 | 5/2001 |

OTHER PUBLICATIONS

English language abstract of the Japanese Publication No. 2001-091597.

English language abstract of the Japanese Publication No. 2001-134458.

* cited by examiner

TEST APPARATUS FOR MIXED-SIGNAL SEMICONDUCTOR DEVICE

CROSS REFERENCE TO RELATED APPLICATION

This U.S. non-provisional application claims priority from Korean Patent Application No. 2004-55108, filed on Jul. 15, 2004, the entire content of which is hereby incorporated herein by reference for all purposes.

BACKGROUND OF THE INVENTION

1. Field of the Invention:

The present invention relates to test apparatus for semiconductor devices and, more particularly, to test apparatus for testing the operational reliability of mixed-signal semiconductor devices.

2. Description of the Related Art:

Large scale integration (LSI) devices refer to electronic circuits that have many components on a single chip. A system LSI may include a plurality of circuits having different functions, such as a central processing unit, a memory, an integrated circuit for processing video and audio data, and an integrated circuit for communication. A System On Chip (SOC) is an example of the system LSI. A SOC may use a mixture of analog and digital signals. A test apparatus for testing the reliability of an SOC semiconductor device may require testing of both digital and analog signals.

FIG. 1 is a schematic view of one example of a conventional test apparatus for a mixed-signal semiconductor device. FIG. 2 is a block diagram of the device shown in FIG. 1. It is noted that the test apparatus shown in FIGS. 1 and 2 is just one example of a conventional test apparatus.

As shown in FIGS. 1 and 2, the test apparatus comprises a test controller 310, a test head 320, a performance board 360, a device under test (DUT) 350, and a test fixture 370.

The test head 320 includes a combination of the same-type of tester modules and of different-type tester modules. For example, a test head may include a high speed signal tester module and a low speed signal tester module.

Each tester module includes a plurality of event tester boards 321 and 323. The event tester boards 321 and 323 include a plurality of event testers 331 corresponding to tester pins. The event tester boards 321 perform analog processing and the event tester boards 323 perform a digital processing.

The test controller 310 may be a host computer. It controls a plurality of event tester boards 321 and 323 through a system bus 315. For example, as shown six event tester boards 321 and 323 are installed in a single tester module. The test apparatus may include two or more tester modules.

The analog processing event tester board 321 applies a test pattern to the DUT 350 and tests a response signal from the DUT 350. An option circuit 341 connects the event tester board to the analog pins on the DUT 350. The option circuit 341 includes a D/A converter, an A/D converter and a filter.

The event tester boards 321 and 323 include event testers 331 for thirty two-channels, an interface 332, a processor 333 and a memory 334. Each event tester 331 has the same inner structure as the tester pins. The event tester 331 may include an event memory 335, an event operation unit 336, a driver/comparator 337 and a capture memory 338. The event memory 335 memorizes an event data for generating the test pattern. The event operation unit 336 generates the test pattern based on the event data. The driver/comparator 337 compares an output signal and an expected signal from the DUT 350. The capture memory 338 stores the test result. The A/D converter in the option circuit 341 converts an analog signal to a digital signal.

The interface 332 and processor 333 are connected to the tester controller 310 through the system bus 315. The interface 332 transmits data from the tester controller 315 to a register on the event tester board 321, so as to assign the event testers 331 to input/output pins of the DUT 350.

The processor 333 controls the operations occurring on the event tester boards 321 and 323, including generating the test pattern, evaluating the output signal from the DUT 350, and detecting faulty data.

The test head 320 provides a plurality of tester modules depending on the number of pins in the test fixture 370 and the type and the number of pins on the DUT 350. The test fixture 370 may include a plurality of elastic connectors such as pogo pins. The test fixture 370 electrically and mechanically connects the event tester boards 321 and 323 and the performance board 360. The DUT 350 is inserted in a test socket of the performance board 360, which establishes an electrical communication with the test apparatus 300.

A test pattern is generated by the event tester boards 321 and 323 and is applied to pins of the DUT 350 through the performance board 360. In response to the test pattern, the output signal from the DUT 350 is transmitted to the event tester boards 321 and 323 through the performance board 360. The output signal is compared with an expected signal. The success or failure of the DUT 350 is then determined. Each tester module includes a connector to the test fixture 370.

A conventional test apparatus for a mixed-signal semiconductor device includes an event tester board having a video signal source/digitizer function for testing a low frequency analog signal such as an audio signal and a high frequency analog signal such as a video signal. Therefore, conventional test apparatus may simultaneously test an A/D converter circuit, a logic circuit and a D/A converter circuit of a mixed-signal semiconductor device.

The number of DUTs is determined by the number of analog event tester boards. As the number of the analog event tester boards increases, the number of the DUT may increase, thereby allowing a parallel test. A test apparatus for a mixed-signal semiconductor device may employ two sets of analog event tester boards, realizing two-parallel test.

However, increasing the number of analog event tester boards may result in an increase in production cost. When considering the ratio of performance to production cost, it may be inefficient to increase the number of event tester boards.

SUMMARY OF THE INVENTION

The present invention is directed to a test apparatus for a mixed-signal semiconductor device which increases the number of parallel tests without use of additional analog event tester boards.

The test apparatus includes a plurality of event tester modules. The modules include analog signal tester boards and digital signal tester boards. A performance board is provided with sockets for receiving DUTs. A connection means electrically connects the performance board and the event tester module to the DUT. An option circuit connects the DUT when the DUT is a mixed-signal integrated circuit including an analog function block and a digital function block. A switching parallel connection circuit sequentially connects a plurality of single event tester boards to a plurality of the DUTs. The event tester board and the DUTs are connected as a group. A tester controller controls the overall operation related to test. The tester controller communicates with the event tester module through a system bus.

BRIEF DESCRIPTION OF THE DRAWINGS

These and other features and advantages of the preferred embodiments of the present invention will be readily understood with reference to the following detailed description thereof provided in conjunction with the accompanying drawings, wherein like reference numerals designate like structural elements, and in which.

These drawings are provided for illustrative purposes only and are not drawn to scale. The spatial relationships and relative sizing of the elements illustrated in the various embodiments may have been reduced, expanded or rearranged to improve the clarity of the figure with respect to the corresponding description. The figures, therefore, should not be interpreted as accurately reflecting the relative sizing or positioning of the corresponding structural elements that could be in an actual device manufactured according to the preferred embodiments of the invention.

DETAILED DESCRIPTION OF PREFERRED EMBODIMENTS

The present invention will now be described more fully hereinafter with reference to the accompanying drawings, in which preferred embodiments of the invention are illustrated. This invention may, however, be embodied in many different forms and should not be construed as limited to the particular embodiments set forth herein. Rather, these embodiments are provided so that this disclosure will be thorough and complete, and will fully convey the scope of the invention to those skilled in the art.

In the description, well-known structures and processes have not been described or illustrated in detail to avoid obscuring the present invention. It will be appreciated that for simplicity and clarity of illustration, some elements illustrated in the figures have not necessarily been drawn to scale. For example, the dimensions of some of the elements have been exaggerated or reduced relative to other elements for clarity.

Figure 1:
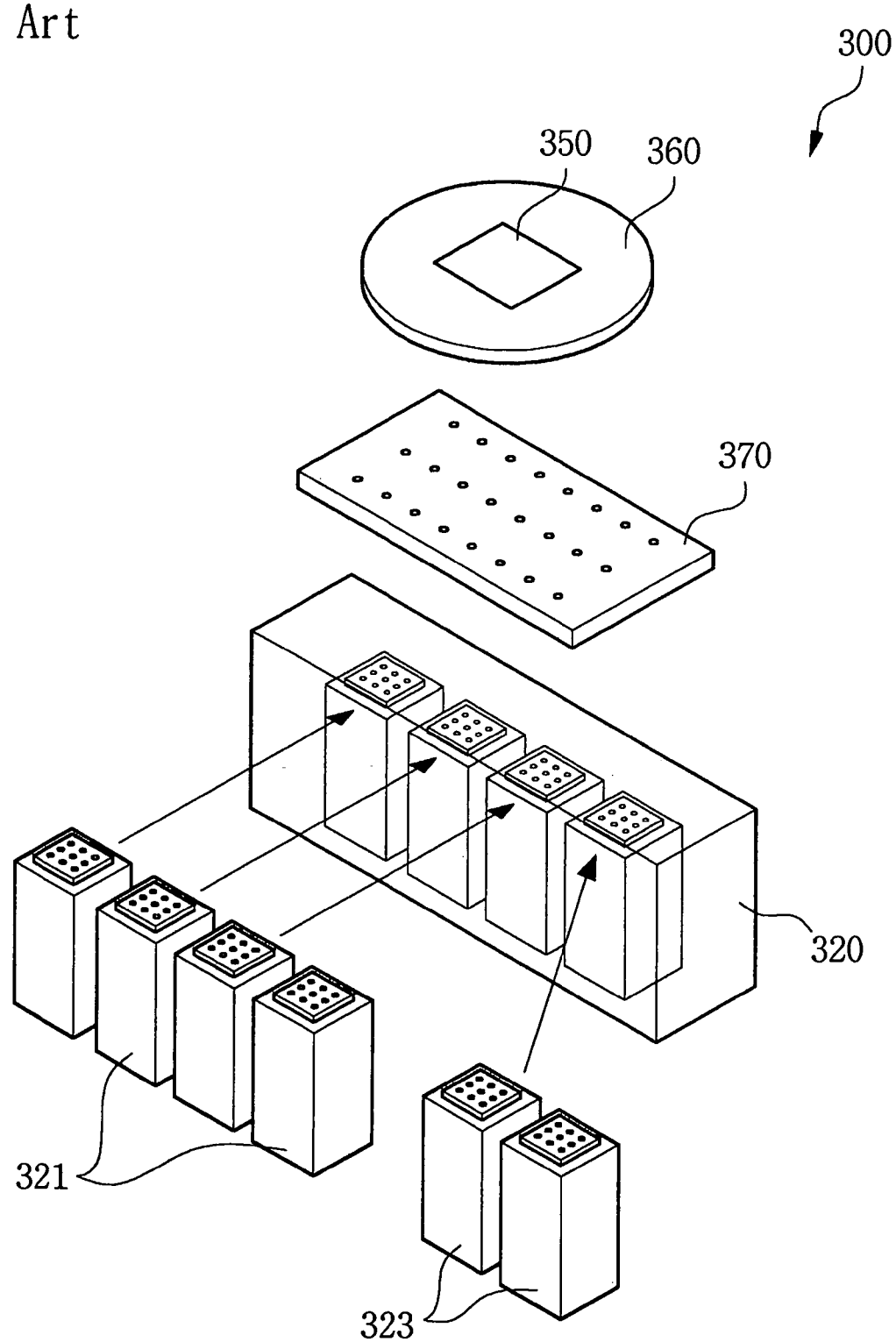
FIG. 1 is a schematic view of one example of a conventional test apparatus for a mixed-signal semiconductor device.
Figure 2:
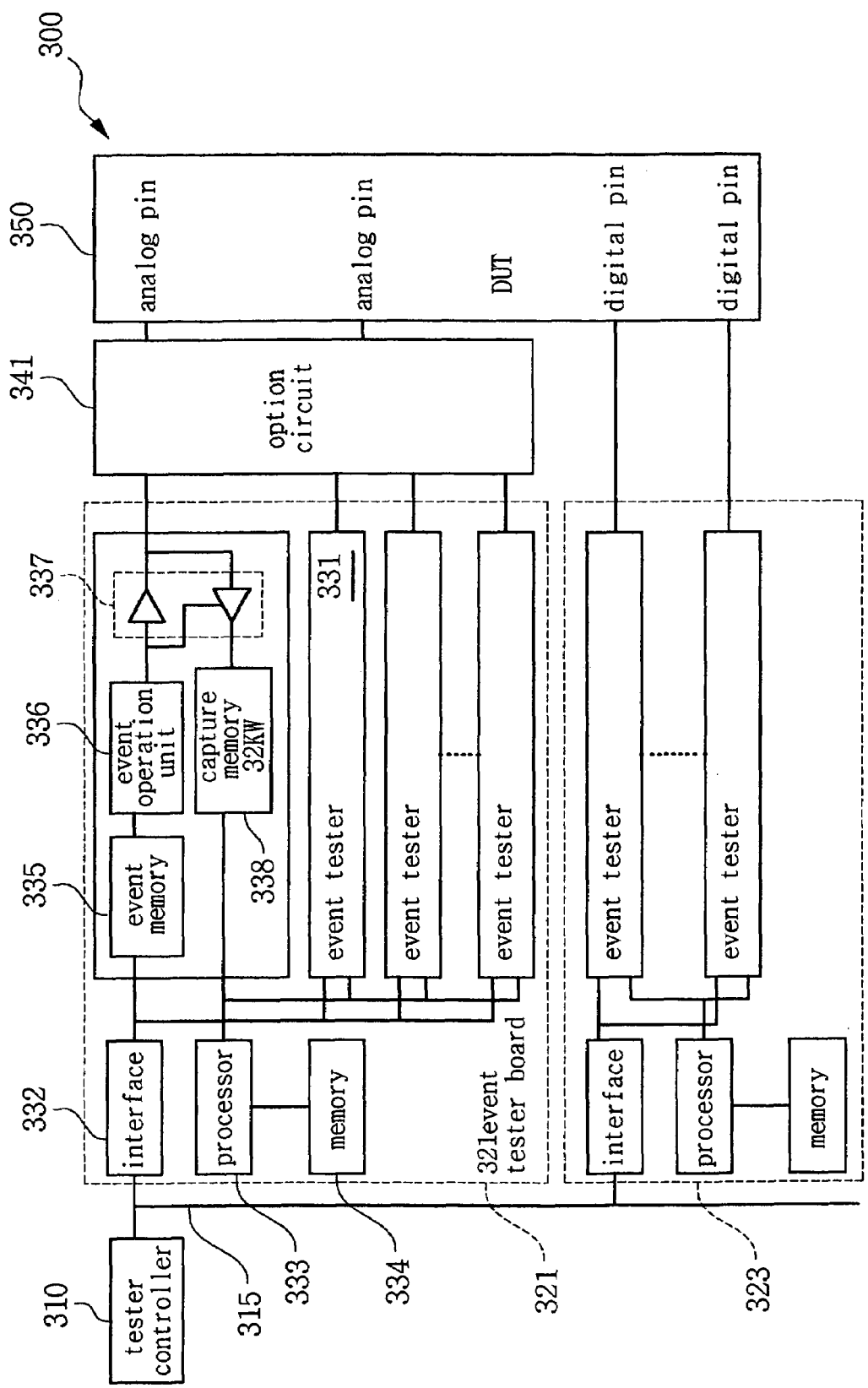
FIG. 2 is a block diagram of one example of a conventional test apparatus for a mixed-signal semiconductor device.
Figure 3:
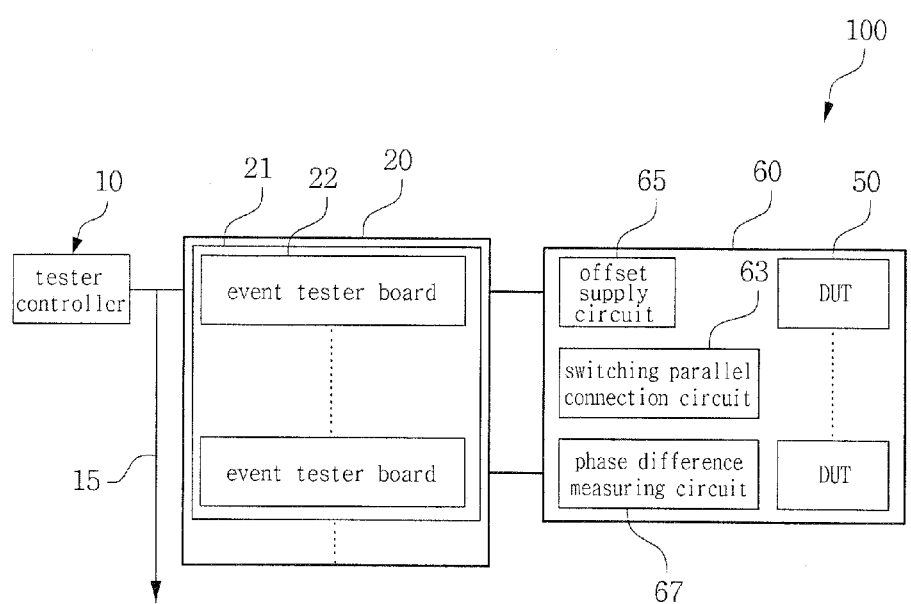
FIG. 3 is a schematic view of a test apparatus for a mixed-signal semiconductor device in accordance with a preferred embodiment of the present invention.

FIG. 3 is schematic view of a test apparatus 100 for a mixed-signal semiconductor device in accordance with a preferred embodiment of the present invention. The test apparatus 100 includes a test head 20 adapted to receive a tester module 21, and a performance board 60. The tester module 21 includes a plurality of event tester boards 22. A tester controller 10 controls the overall operation. The tester controller 10 communicates with the tester module through a system bus 15. A test fixture (not shown) electrically connects the performance board 60 and the tester module 21 to a DUT 50 and to the event tester boards 22.

The event tester boards 22 include event tester boards for testing an analog signal and event tester boards for testing a digital signal. The analog event tester boards include event tester boards for supplying and measuring a low frequency signal such as an audio signal, and event tester boards for supplying and measuring a high frequency signal such as a video signal.

The test head 20 is adapted to receive a plurality of the tester modules 21. The performance board 60 has a socket (not shown). The socket is adapted to receive the DUTs 50. The performance board 60 includes a circuit for making an electrical connection to the test fixture and to the DUTs 50. The performance board 60 has a plurality of sockets adapted to receive a plurality of the DUTs 50. The performance board 60 includes a switching parallel connection circuit 63, an offset supply circuit 65 and a phase difference measuring circuit 67.

The switching parallel connection circuit 63 selectively connects a plurality of the DUTs 50 and a single event tester board 22. The DUTs 50 and the event tester board 22 are sequentially connected by a group unit. The connection of the DUTs 50 and the event tester board 22 is controlled by the tester controller 10.

The offset supply circuit 65 includes an offset adjustment circuit. The offset adjustment circuit adjusts the offset of a low frequency signal. The offset supply circuit 65 may include a direct path in a situation where an offset adjustment is not required. Therefore, the offset is adjustable according to the type of DUT 50.

The phase difference measuring circuit 67 is configured such that input and output of the DUTs 50 are connected with the event tester boards 22 in order to test a low frequency signal. The phase difference measuring circuit 67 calculates the phase difference between the low frequency signal and a measured phase value. The signal measurement is synchronized at the input and output of the DUT 50. Thus, a phase change may be detected. The test results are stored in a memory on the event tester board 22. The software in the tester controller 10 calculates the phase difference, based on the stored data.

In the specific embodiment described herein, the tester board includes eight event tester boards having a low frequency signal source function and eight event tester boards having a high frequency signal digitizer function, eight event tester boards having a high frequency signal source function, and four event tester boards having a high frequency signal digitizer function.

Figure 4:
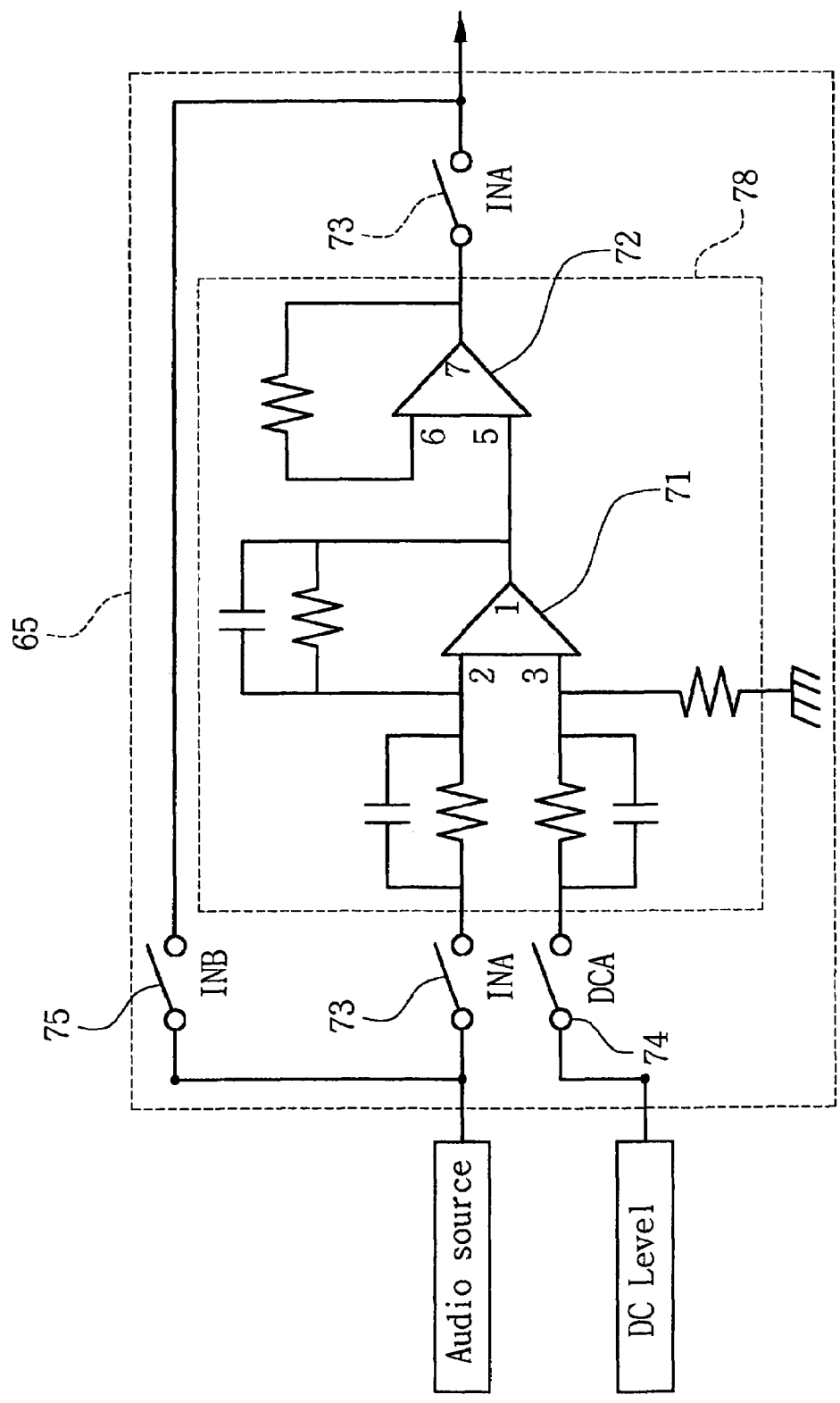
FIG. 4 is a schematic view of an offset supply circuit of a test apparatus for a mixed-signal semiconductor device in accordance with a preferred embodiment of the present invention.

FIG. 4 is a view of an offset supply circuit for a mixed-signal semiconductor device in accordance with a preferred embodiment of the present invention. The offset supply circuit 65 may be part of a performance board 60 for testing low frequency signals, for example, an audio frequency signal. The offset supply circuit 65 may supply offset for an audio frequency signal source.

The offset supply circuit 65 includes a dual operational (OP) amplifier 78 having two OP amplifiers 71 and 72. These OP amps may, for example, be a KA 4558 dual OP amplifier. The offset supply circuit 65 forms an offset adder circuit using the dual OP amplifier 78. A signal path is through relay switches INA 73 and DCA 74. If an offset is not needed, a direct path can be formed so that it does not pass through the dual OP amplifier 78. The direct path may be established according to on/off state of relay switch INB 75.

The OP amplifiers 71 and 72 include a first OP amplifier 71 and a second OP amplifier 72. The first OP amplifier 71 uses the audio frequency signal source and a DC level as an input. The second OP amplifier 72 uses an output of the first OP amplifier 71 as one input and a feedback signal from the output of the second OP amplifier 72 as the other input. The relay switches INA 73 is at the front end of the input and the rear end of the output of the dual amplifier 78. The relay switch DCA 74 is at the front end of the DC level input. The direct path extends from the front end of the relay switch INA 73 at the input of the dual OP amplifier 78 to the rear end of the relay switch INA 73 at the output of the dual OP amplifier 78. The relay switches 73, 74 and 75 are controlled by the test controller 10. A resistance and a capacitor are applied at OP amplifier 71 as required for offset or noise reduction. Typically, an audio frequency source can apply the same offset to up to eight output ports. Thus, in the preferred embodiment of the present invention, the audio frequency source is applied to eight output ports.

Figure 5:
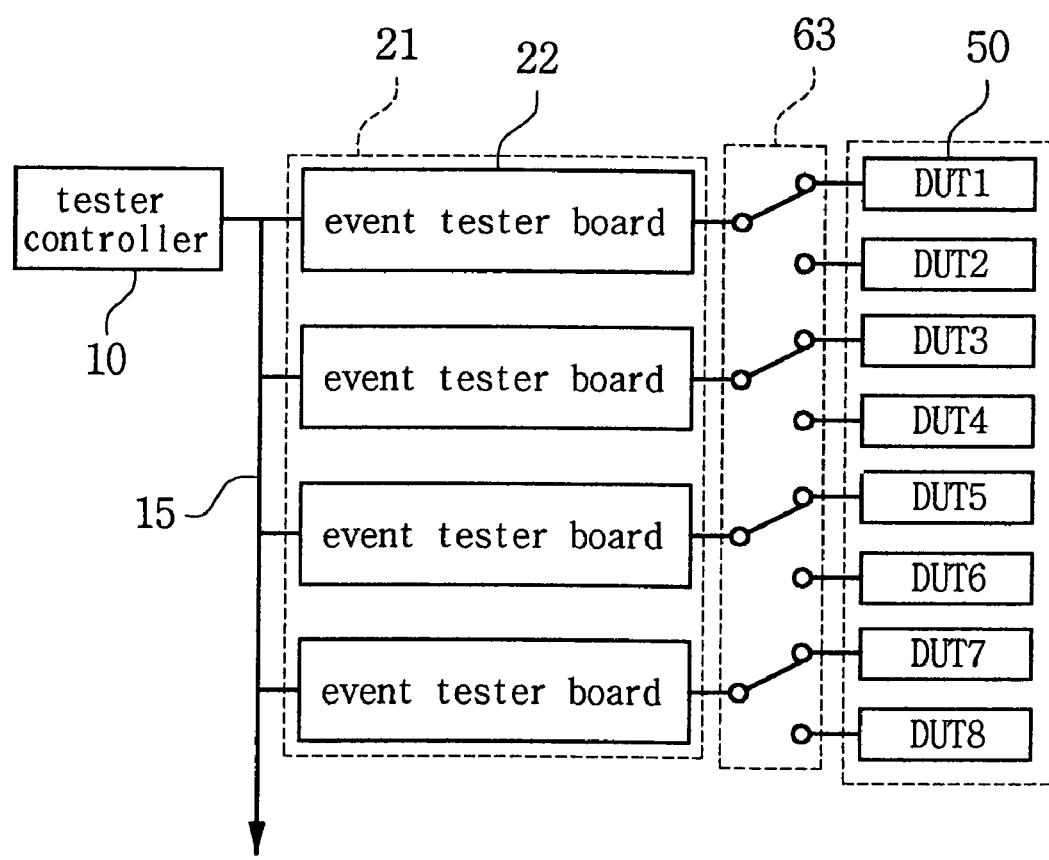
FIG. 5 is a schematic view of a switching parallel connection circuit of a test apparatus for a mixed-signal semiconductor device in accordance with a preferred embodiment of the present invention.

FIG. 5 is a view of the switching parallel connection circuit 63 which is part of this preferred embodiment of the present invention. The switching parallel connection circuit 63 is arranged to test eight DUTs 50 using four event tester boards 21, each of which has a digitizer function for a high frequency signal such as a video signal. For example, eight DUTs 50 may be tested two sets by four event tester board 22 having a video frequency digitizer function through relay switch of circuit 63.

Figure 6:
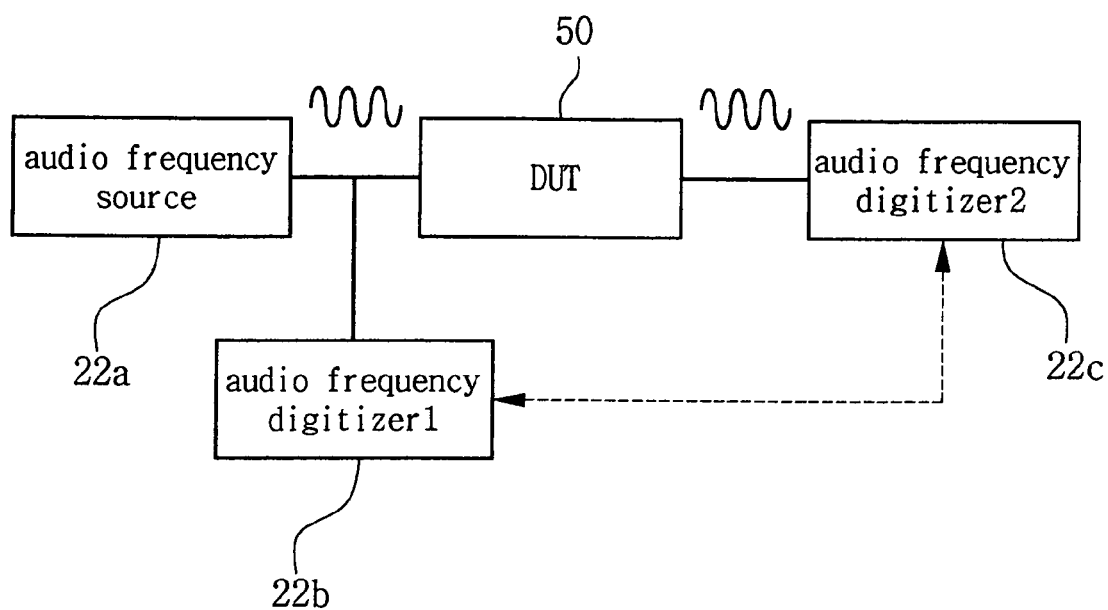
FIG. 6 is a schematic view of a phase difference measuring circuit of a test apparatus for a mixed-signal semiconductor device in accordance with a preferred embodiment of the present invention.

FIG. 6 is a view of a phase difference measuring circuit for the test apparatus of this preferred embodiment of the present invention. As shown in FIG. 6, event tester boards 22b and 22c each of which has an audio frequency source function, are respectively connected to the front end (the input) and the rear end (the output) of the DUT 50. They are connected on the supply path from an event tester board 22a that has an audio frequency source function. The measured value is compared by a comparator on the event tester boards 22b and 22c. The results are stored in a memory. Information stored in the memory is processed by software operating in the test controller 10. Thus, the phase difference can be calculated. The event tester boards 22 that have an audio frequency digitizer function allow a two-path measurement for the DUTs 50. The event tester boards 22b and 22c that have an audio frequency digitizer function, assigned to a single DUT 50 may be synchronized.

The test apparatus of this preferred embodiment of the invention eliminates the use of a Time Measurement Unit (TMU) which is frequently used in conventional test apparatus.

In accordance with the preferred embodiment of the present invention, the test apparatus employs small-sized components so as to minimize the circuit area which may result due to the addition of semiconductor devices to be tested. Board design routing may be optimized so as to reduce an electrical interference between semiconductor devices to be tested.

In accordance with this preferred embodiment of the present invention, a test apparatus for a mixed-signal semiconductor device may increase productivity.

Accordingly, the number of parallel tests may be increased through an improved tester board. The number of parallel test may also be increased through an improved performance board without the use of an extra event tester board for an analog signal test. Therefore, the test time may reduce and productivity may increase, thereby improving a rate of performance to cost.

Although the preferred embodiments of the present invention have been described in detail hereinabove, it should be understood that many variations and/or modifications of the basic inventive concepts herein taught, which may appear to those skilled in the art, will still fall within the spirit and scope of the preferred embodiments of the present invention as defined in the appended claims.

What is claimed is:

1. A test apparatus for testing mixed-signal semiconductor devices under test (DUTs) that include an analog function block and a digital function block, the test apparatus comprising:
   a tester module including a plurality of event tester boards, the event tester boards including analog signal tester boards and digital signal tester boards;
   a test head to receive the tester module;
   a performance board that includes a plurality of sockets for the DUTs;
   a test fixture including connection means, the connection means electrically connecting the performance board and the tester module to the DUTs and to the event tester boards;
   a test controller for controlling an overall operation of the test apparatus; and
   a switching parallel connection circuit for sequentially connecting each one of the event tester boards with a plurality of the DUTs.

2. The test apparatus of claim 1, wherein the switching parallel connection circuit is in the performance board.

3. The test apparatus of claim 1, wherein the performance board includes an offset supply circuit.

4. The test apparatus of claim 3, wherein the offset supply circuit includes an offset adjustment circuit and a direct path, the offset adjustment circuit having, a low frequency signal source, a DC level source, a first OP amplifier and a second OP amplifier, the first OP amplifier using the low frequency signal source and the DC level as inputs and the second OP amplifier using the input of the first OP amplifier as one input and an output of the second OP amplifier as the other input, the direct path directly connecting the low frequency signal source and an output of the performance board.

5. The test apparatus of claim 1, wherein the event tester boards have a low frequency signal source function and a low frequency signal digitizer function.

6. The test apparatus of claim 5, the event tester boards connected to an input and output of the DUTs and the test controller calculates the phase difference between an input signal phase and an output signal phase by a measured value.

7. The test apparatus of claim 1, wherein the event tester boards comprise no more than four event tester boards having analog source/digitizer functions, each event tester board is connected to a set of two DUTs, and sets of two DUTs are tested in two sets of tests by a switching operation of the switching parallel connection circuit.

8. The test apparatus of claim 1, wherein the DUTs are System On Chip (SOC) semiconductor devices.

9. The test apparatus of claim 1, further comprising an option circuit corresponding to the DUTs when the DUTs are a mixed-signal integrated circuit including an analog function block and a digital function block.

10. A test apparatus for testing mixed-signal semiconductor devices under test (DUTs) that include an analog function block and a digital function block, the test apparatus comprising:

a tester module including a plurality of event tester boards, the plurality of event tester boards including analog signal tester boards and digital signal tester boards;

a performance board that includes a plurality of sockets for the DUTs;

a test fixture including connection means, the connection means electrically connecting the performance board and the tester module to the DUTs and to the event tester boards;

a test controller for controlling an overall operation of the test apparatus; and a switching parallel connection circuit for sequentially connecting each one of the event tester boards with a plurality of the DUTs.

11. The test apparatus of claim 9, wherein the switching parallel connection circuit is part of the performance board.

12. The test apparatus of claim 9, wherein the performance board includes an offset supply circuit.

13. The test apparatus of claim 12, wherein the offset supply circuit includes an offset adjustment circuit and a direct path, the offset adjustment circuit having, a low frequency signal source, a DC level source, a first OP amplifier and a second OP amplifier, the first OP amplifier using the low frequency signal source and the DC level as inputs and the second OP amplifier using the input of the first OP amplifier as one input and an output of the second OP amplifier as the other input, the direct path directly connecting the low frequency signal source and an output of the performance board.

14. The test apparatus of claim 10, further comprising an option circuit corresponding to the DUTs when the DUTs are a mixed-signal integrated circuit including an analog function block and a digital function block.

15. A test apparatus for testing a plurality of mixed-signal semiconductor devices under test (DUTs) that output analog signals and digital signals, the test apparatus comprising:

event tester boards for testing the analog signals and for testing the digital signals;

a performance board that includes a plurality of sockets to receive the DUTs;

means for electrically connecting the performance board to the DUTs and to the event tester boards;

parallel switching means for sequentially connecting each one of the event tester boards with some of the DUTs; and a tester controller for controlling the overall operation of the test apparatus.

16. The test apparatus of claim 15, wherein the performance board includes an offset supply circuit, the offset supply circuit including an offset adjustment circuit and a direct path, the offset adjustment circuit having, a low frequency signal source, a DC level source, a first OP amplifier and a second OP amplifier, the first OP amplifier using the low frequency signal source and the DC level as inputs and the second OP amplifier using the input of the first OP amplifier as one input and an output of the second OP amplifier as the other input, the direct path directly connecting the low frequency signal source and an output of the performance board.

17. The test apparatus of claim 15, further comprising an option circuit corresponding to the DUTs when the DUTs are a mixed signal integrated circuit including an analog function block and a digital function block.

* * * * *

UNITED STATES PATENT AND TRADEMARK OFFICE
CERTIFICATE OF CORRECTION

PATENT NO. : 7,472,321 B2  Page 1 of 1
APPLICATION NO. : 11/040132
DATED : December 30, 2008
INVENTOR(S) : Byoung-Ok Chun It is certified that error appears in the above-identified patent and that said Letters Patent is hereby corrected as shown below:

Column 6, line 48, the word "boards" should read -- boards are --;
Column 6, line 49, the word "output" should read -- an output --;
Column 7, line 15, the words "claim 9" should read -- claim 10 --;
Column 7, line 17, the words "claim 9" should read -- claim 10 --.

Signed and Sealed this

Fifth Day of May, 2009

JOHN DOLL
*Acting Director of the United States Patent and Trademark Office*